United States Patent [19]

Ueno et al.

[11] Patent Number: 4,488,261
[45] Date of Patent: Dec. 11, 1984

[54] FIELD PROGRAMMABLE DEVICE

[75] Inventors: Kouji Ueno; Tamio Miyamura, both of Kawasaki, Japan

[73] Assignee: Fujitsu Limited, Kawasaki, Japan

[21] Appl. No.: 353,356

[22] Filed: Mar. 1, 1982

[30] Foreign Application Priority Data

Mar. 2, 1981 [JP] Japan .................................. 56-29727

[51] Int. Cl.$^3$ ............................................. G11C 11/40
[52] U.S. Cl. ...................................... 365/104; 365/105
[58] Field of Search ................. 365/96, 103, 104, 105, 365/174, 175, 189; 307/449, 463; 357/41, 45; 29/584, 585, 586

[56] References Cited

U.S. PATENT DOCUMENTS

| | | | |
|---|---|---|---|
| 3,733,690 | 5/1973 | Rizzi et al. ...................... | 365/104 X |
| 3,742,592 | 7/1973 | Rizzi et al. ...................... | 365/105 X |
| 4,237,547 | 12/1980 | Smith ............................... | 365/104 X |
| 4,312,047 | 1/1982 | Donoghue ....................... | 365/104 X |

*Primary Examiner*—Robert L. Richardson
*Attorney, Agent, or Firm*—Staas & Halsey

[57] ABSTRACT

A field programmable device comprises a plurality of word lines, a plurality of bit lines which are disposed in a manner to intersect the word lines, a plurality of cells which are respectively connected to the word lines and the bit lines, and a plurality voltage supply means, each of comprising a series connection of a resistor and a diode whose cathode is connected to each of the word lines. The voltage supply means supplies non-selected the word lines with a voltage high enough to prevent parasitic P-N-P-N elements, which are formed by the cells and the word lines, from turning on. Thus a programming current is hindered from flowing out of the cells.

7 Claims, 12 Drawing Figures

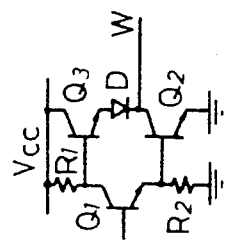
Fig. 3
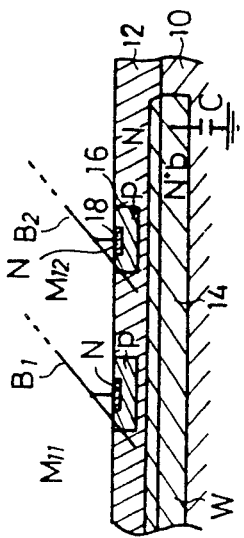
Fig. 5
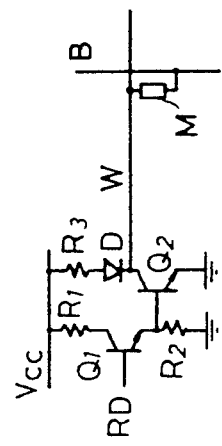
Fig. 2
Fig. 4

FIELD PROGRAMMABLE DEVICE

BACKGROUND OF THE INVENTION

The present invention relates to a field programmable device, more particularly, a programmable read-only memory (P-ROM) with junction-shorting type memory cells.

FIG. 1 shows a programmable device in which the contents of a ROM can be written in accordance with a user's need. As shown in FIG. 1, each memory cell of the junction breakdown type employed in the programmable ROM device has the structure of a transistor whose base is not wired. Such memory cells $M_{11}$, $M_{12}$ . . . are connected at the point of intersection between word lines $W_1$, $W_2$ . . . and bit lines $B_1$, $B_2$ . . . . A writing operation is carried out in such a way that the cell is supplied with a writing current (programming current) to break down the emitter-base junction of the cell (i.e., to bring the cell into its conductive state) and thus turn the cell into a P-N diode (e.g., $M_{12}$ or $M_{21}$) formed at the base-collector junction. More specifically, one of the bit lines and one of the word lines are sequentially selected in accordance with data to be written, and the aforementioned writing operation is executed for each cell located at the intersection point between the particular word line and bit line. A P-N-P-N structure is therefore formed between the cell for which the writing operation has been completed (and which has become a diode), and the cell for which the writing operation has not been completed which remains a transistor. In order to stably and reliably program the ROM, the writing current needs to be applied between the selected bit line and word line without turning the SCR "on", thereby permitting the writing current to be supplied to the cell at the intersection point of these lines.

The aforementioned word line is formed of a diffused layer. In a case where the diffused layer has defects and where the non-selected word line, which ought to hold a high withstand voltage during the writing operation, allows current to leak out, the programming (writing) current flows out to the substrate of the cell through a parasitic P-N-P transistor which is formed by the cell and the substrate. Even when the leakage current is slight, it is multiplied by $\beta$ (current gain) by means of the P-N-P transistor. Therefore, the leakage current needs to be suppressed to the utmost.

SUMMARY OF THE INVENTION

An object of the present invention is to provide a programmable device capable of stable and reliable programming.

Another object of the present invention is to prevent the turn-on of a P-N-P-N structure in a junction breakdown type memory; the P-N-P-N structure being formed by a memory cell in which data has been written (which has become a diode), and a memory cell in which data has not been written (which remains a transistor).

Still another object of the present invention is to suppress a leakage current which is attributed to a vertical type parasitic transistor appearing in the writing mode of the memory; in a junction breakdown type memory.

In one aspect of performance of the present invention, a field programmable device comprises a plurality of word lines, a plurality of bit lines which are disposed in a manner to intersect the word lines, a plurality of cells which are respectively connected to the word lines and the bit lines, and a voltage supply means. The voltage supply means supplies non-selected ones of word lines with voltage large enough to prevent parasitic P-N-P-N elements, which are formed by the cells and the word lines, from turning on, whereby the programming current for the cells is hindered from flowing out.

Further objects and features of the present invention will become apparent from the following detailed description with reference to the accompanying drawings.

BRIEF DESCRIPTION OF THE DRAWINGS

FIGS. 2 and 3 are circuit diagrams of the arrangement of a word driver in the P-ROM;

FIG. 4 is a schematic sectional view of an example of the bit lines of the semiconductor of the P-ROM in FIG. 1;

FIG. 5 is an equivalent circuit diagram of the bit lines in FIG. 4;

DESCRIPTION OF THE PREFERRED EMBODIMENTS

Figure 1:
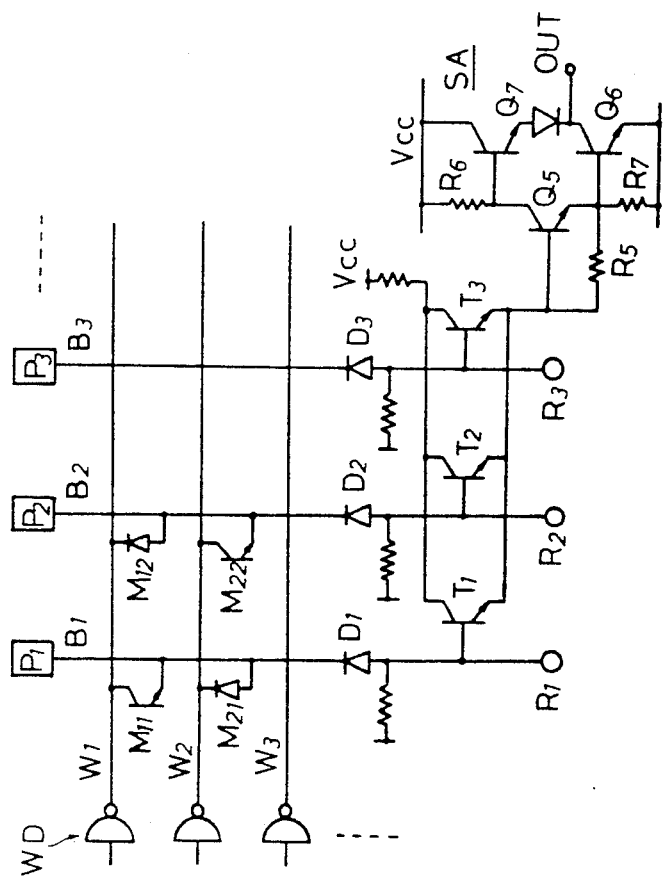
FIG. 1 is a circuit diagram schematically showing a P-ROM.

Referring to FIG. 1, symbol WD represents a word driver which drives the corresponding word line to a H (high) or L (low) level. As shown in FIG. 2 or FIG. 3, the circuit arrangement of the word driver comprises transistors $Q_1$-$Q_3$ (FIG. 3) (or $Q_1$ and $Q_2$ (FIG. 2)), resistors $R_1$-$R_3$ (FIG. 2) (or $R_1$ and $R_2$ (FIG. 3)) and a diode D (FIGS. 2 and 3). In operation, the input transistor $Q_1$ receives an output RD from a row decoder, and the output stage (transistor $Q_2$ (FIG. 2) or transistors $Q_2$ and $Q_3$ (FIG. 3)) drives the word line W. In FIG. 3 when the decoder output RD=H, the transistors $Q_1$ and $Q_2$ turn "on" and the transistor $Q_3$ turns "off", so that the word line W becomes the L level. This is the selected state of the word line. In the non-selected state of the word line, the decoder output RD=L is received, the transistors $Q_1$, $Q_2$ turn "off" and the transistor $Q_3$ turns "on", and the word line W becomes the H level. The word driver in FIG. 2 is called a resistor drive type word driver, while the word driver in FIG. 3 is a type provided with an off-buffer. Shown at $P_1$, $P_2$ . . . in FIG. 1 are programming terminals, which are supplied with the writing current during the writing mode of the programmable ROM. (More specifically, the writing current is fed from a constant-current source of approximately 120 mA and the corresponding voltage becomes approximately 15 V at the maximum. A supply voltage Vcc is 5 V. In writing data into, for example, the memory cell $M_{11}$, the word line $W_1$ is an L level because of the word driver WD, and the writing current is applied from the terminal $P_1$ to the cell $M_{11}$.

Then, this cell $M_{11}$ has its emitter-base junction broken down and becomes a diode, allowing current to flow from the bit line $B_1$ to the word line $W_1$. Shown at $R_1$, $R_2$... are reading terminals which receive outputs from a column decoder in the reading mode of the P-ROM. By way of example, when an H (high) level voltage is applied to the terminal $R_1$ with the word line $W_2$ selected, current flows through a path including the terminal $R_1$, a diode $D_1$, the memory cell $M_{21}$, the word line $W_2$ and the word driver WD, hence, the bit line $B_1$ becomes an L (low) level. Consequently, a transistor $T_1$ is in an "off" state, and a sense amplifier SA, which is composed of resistors $R_5$-$R_7$, transistors $Q_5$-$Q_7$, etc., turns the transistors $Q_5$ and $Q_6$ "off" and the transistor $Q_7$ "on", so that the output OUT of the P-ROM becomes an H (high) level. On the other hand, when the memory cell is not written into, e.g., $M_{11}$ is selected, the corresponding bit line becomes an H (high) level, and the output of the sense amplifier SA becomes an L (low) level. In this way, the stored contents of the P-ROM are read out.

FIG. 4 shows a particular structure of the essential portions of a P-ROM. Numeral 10 designates a P-type semiconductor substrate, which is formed with an N-type epitaxial layer 12 on its surface portion and an N+-type buried layer 14 in its interior. The epitaxial layer 12 is formed containing P-type diffused regions 16. In each P-type diffused region 16 an N-type diffused region 18 is formed. These parts, 12, 16 and 18, serve as the collector, base and emitter regions of the memory cell transistor, respectively. It is assumed that the memory cell $M_{11}$ of the structure has not been written into, whereas the memory cell $M_{12}$ has been written into, as in FIG. 1. Since the emitter-base junction of the written cell $M_{12}$ is in a short-circuited state, the bit line $B_2$ is formed with a lateral P-N-P transistor ($Tr_1$ in the equivalent circuit diagram FIG. 5) which is constructed of the P-type regions 18 of the cell $M_{12}$, the N-type layer 12, and the P-type region of the cell $M_{11}$. The unwritten cell $M_{11}$ constructs a vertical transistor ($Tr_2$ in FIG. 5) out of the N-type layer 18, and P-type layer 16, and the N-type layer 12. These transistors $Tr_1$ and $Tr_2$ and the bit lines $B_1$ and $B_2$ are connected as shown in FIG. 5. A P-N-P-N element, a thyristor, is connected between the bit lines $B_2$ and $B_1$, that is, between the bit line of the written cell and the unwritten cell.

Since this P-N-P-N element does not have a trigger terminal, it may seem not to turn "on". However, the N-type layer 12 which acts as the base of the lateral transistor $Tr_1$ and the collector of the vertical transistor $Tr_2$ has a large capacitance C with respect to ground of the P-ROM. Therefore, when a voltage is applied to the bit line $B_2$, a charging current flows through a path comprising the bit line $B_2$, the N-type layer 18 as well as the P-type layer 16, the N-type layer 12 and the capacitor C, and it triggers the P-N-P-N element. The transistor $Tr_1$ is rendered conductive with the charging current acting as its base current and causes its collector current to flow. This collector current becomes the base current of the transistor $Tr_2$ and renders the transistor $Tr_2$ conductive. Once the transistor $Tr_2$ has turned "on", the base current of the transistor $Tr_1$ is maintained by the transistor $Tr_2$, so that the transistors $Tr_1$ and $Tr_2$ hold their "on" states even when the charging current disappears. Since the collector voltage of the transistor $Tr_2$ is fixed to a voltage being about 0.2 V higher than that of the bit line $B_1$, the base voltage of the transistor $Tr_1$ rises to prevent this transistor from turning "off".

Under this condition, when it is intended to write data into another memory cell belonging to the bit line $B_2$, a high voltage is applied to bit line $B_2$. Even when the constant-current source of 120 mA is connected, the writing current flows through a path consisting of the bit line $B_2$, the transistors $Tr_1$ and $Tr_2$, the bit line $B_1$, the written cell of the bit line $B_1$ and the selected word line, without being applied to the selected cell. (Of course, when the bit line $B_1$ does not contain a written cell, the current outflow along the path does not take place.)

Figure 6A:
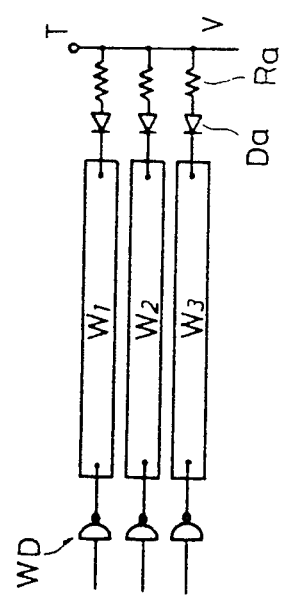
FIG. 6A is a circuit diagram of a first embodiment of the present invention.
Figure 6B:
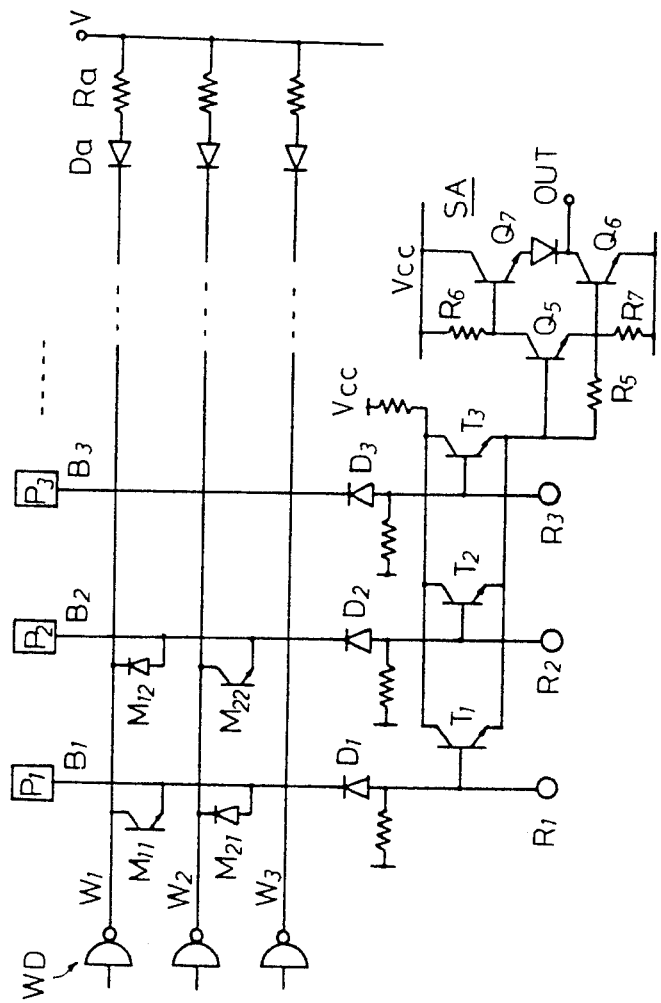
FIG. 6B is a detailed circuit diagram of the embodiment of 6A.

The present invention is based on the above problem involved in the junction breakdown type P-ROM's, and is intended to solve it. FIGS. 6A and 6B show the first embodiment of the present invention. As shown in FIG. 6A, according to the present invention, a high voltage V is applied from an external terminal T to the word lines $W_1$, $W_2$... through respective series circuits each of which comprises a resistor Ra and a diode Da. The charging of the capacitor C is performed, and there is no charging current based on the writing voltage applied to the bit line. Accordingly, the P-N-P-N element at $Tr_1$ and $Tr_2$ does not turn "on", and data can be written into the memory cell, e.g., $M_{22}$ by applying the writing current. FIG. 6B illustrates in detail the first embodiment of the present invention shown in FIG. 6A. Like parts are designated by like references in FIG. 1 and FIG. 6B. The sense amplifier SA functions to read out the contents of the memory cells.

Figure 7:
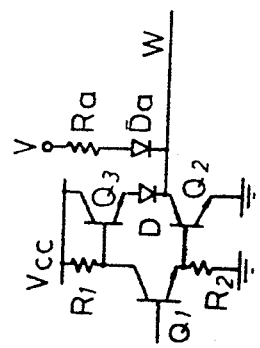
FIGS. 7 and 8 are circuit diagrams of second and third embodiments of the present invention; respectively.
Figure 8:
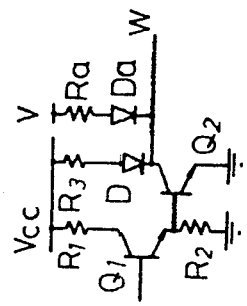

FIGS. 7 and 8 show the second and third embodiments of the present invention in which the high voltage V is applied to the word line W through the resistor Ra as well as the diode Da on the word driver side, as in FIGS. 2 and 3, respectively.

Figure 9:
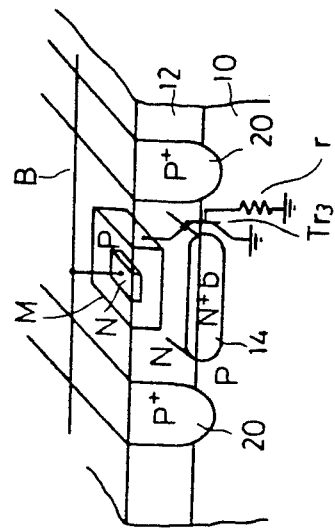
FIGS. 9 and 10 are a schematic perspective view and an equivalent circuit diagram, respectively for explaining a problem which is involved in the memory illustrated in FIG. 4.
Figure 10:
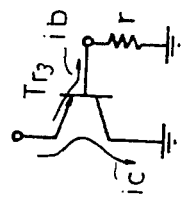

When the leakage occurs between the word line and another region, the parasitic P-N-P transistor, which is inherent in a P-N junction and whose collector is the substrate, turns "on". The result is a current, corresponding to the collector current $i_b \cdot \beta$ ($i_b$ being the base current of the parasitic transistor), which flows out to the substrate. This phenomenon will be described with reference to FIGS. 9 and 10. The parasitic P-N-P transistor is a vertical transistor $Tr_3$ whose emitter is the P-type base region of a memory cell M, whose base is the N-type collector region of the memory cell M and whose collector is a P-type substrate 10. When a leakage resistance r exists between the substrate 10 and an N-type layer 12 serving as the word line, the base current $i_b$ of the parasitic transistor $Tr_3$ flows in the written cell as illustrated in FIG. 10, so that the transistor $Tr_3$ turns "on", and the collector current $i_c$ is equal to $i_b \cdot \beta$. In the case of the P-ROM, only the selected word line becomes the L level with all the other non-selected word lines kept at the H level, and the selected bit line becomes an HH level (the high voltage level during the writing operation) in the programming mode. Accordingly, even when the selected bit line has the written cell connected thereto and the word line of this cell is not selected and is therefore at the H level, the selected bit line is at the HH level. Therefore, the current $i_b$ flows and the current of the selected bit line flows out to the substrate through the written cell. In contrast, when the HH voltage is applied to the word line W or N-type layer 12 as in the present invention, the base current $i_b$ does not flow and the current outflow is avoided. In FIG. 9, numeral 20 indicates a P+-type isolation region.

Figure 11:
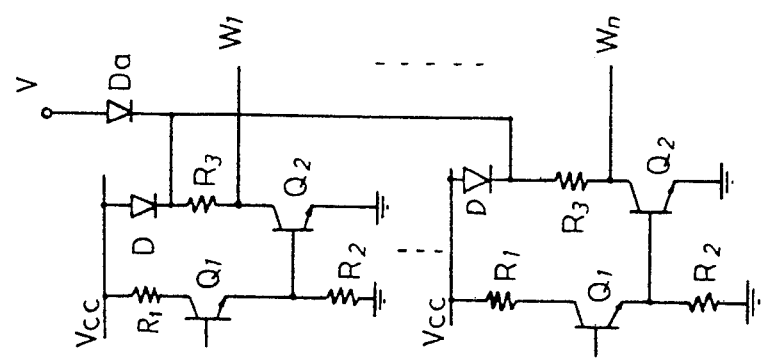
FIG. 11 is a circuit diagram of a fourth embodiment of the present invention.

FIG. 11 shows the fourth embodiment of the present invention. The output stage of each of the word drivers comprises a transistor $Q_2$ and a resistor $R_3$. The transistor $Q_2$ has its emitter grounded its collector connected to one end of the resistor $R_3$. The other end of the resistor $R_3$ is connected to the cathode of a diode D. Further, the cathode of the diode Da is connected to that of the diode D. The anode of the diode D is connected to a voltage source $V_{cc}$, and that of the diode Da to a voltage source V.

In the first to third embodiments of the present invention, the number of pairs of the resistors Ra and the diodes Da is equal to the number of word lines required. The fourth embodiment of the present invention (shown in FIG. 11) requires only one diode Da for all the word lines. Further, in the second and third embodiments, a diode D is required for each of the respective word drivers, whereas in the fourth embodiment, only one diode D suffices for all the word drivers.

As is apparent from the above description, the voltage V applied to the word line is made a fixed voltage which is at least 0.8 V higher than the writing voltage applied to the bit line. The voltage V is also applied to all the word lines in common. In the selected word line, according to the second and third embodiments of the invention, current flows through a path comprising a resistor Ra, a diode Da and an output transistor $Q_2$. Current flows through a path comprising the diode Da, the resistor $R_3$ and the output transistor $Q_2$ in the case of the fourth embodiment. The current is limited by the resistor Ra or the resistor $R_3$. As the power source voltage V is applied to the word lines, the constant current of the writing source is supplied to the programming terminals. In this case, however, the constant-current source needs to include a component which corresponds to the current flowing through the path of the parts Ra, Da and $Q_2$ or the path of the parts $R_3$, Da and $Q_2$. The problems stated before arise, not only in the junction-shorting type memory cells referred to above, but also in fuse type memory cells, diode type memory cells etc., as long as the P-N junctions are arrayed in an identical manner as the epitaxial layer 12. The present invention is also effective when applied to programmable devices employing such memory cells. Furthermore, Schottky diodes may be used as the abovementioned diodes Da and D.

As set forth above, the present invention is very effective in that the turn-on of a parasitic P-N-P-N element and the outflow of a writing current to a substrate ascribable to a parasitic P-N-P transistor can be hindered in the programming mode of a programmable device by the simple expedient of applying a high voltage to the word lines.

We claim:

1. A field programmable device operatively connected to receive a programming current and a power source voltage comprising:
    a plurality of word lines each having selected and non-selected states;
    a plurality of bit lines intersecting said word lines;
    word driver means, operatively connected to said plurality of word lines, for selecting one of said word lines and not selecting the other said word lines;
    a plurality of cells operatively connected to receive the programming current and, respectively, operatively connected at the intersections of said word lines and said bit lines, said cells and said word lines forming parasitic P-N-P-N elements; and
    voltage supply means, operatively connected to said word lines, for supplying said non-selected word lines with a voltage large enough to prevent said parasitic P-N-P-N elements, formed by said cells and said word lines, from turning on, and for hindering the programming current from flowing out of said cells.

2. A field programmable device according to claim 1, wherein said voltage supply means is operatively connected to each of said word lines, and comprises a series connection of a resistor and a diode.

3. A field programmable device operatively connected to receive a power source voltage and an input signal, comprising:
    a plurality of word lines;
    a plurality of bit lines intersecting said word lines;
    a plurality of cells respectively operatively connected at the intersections of said word lines and said bit lines;
    a first resistor operatively connected to ground;
    a plurality of word drivers respectively connected to the intersections of said plurality of word lines for driving corresponding said word lines to a high or low level, each of said word drivers comprising:
        a first transistor having a base supplied with the input signal, having a collector connected to the power source voltage and an emitter operatively connected to said first resistor;
        a second resistor operatively connected to receive the power source voltage;
        a first diode operatively connected in series with said second resistor
        a second transistor having a base connected to said emitter of said first transistor, having a collector operatively connected to said first diode and one of said word lines and having an emitter connected to ground; and
    voltage supply means operatively connected to each of said word lines;
        a second diode operatively connected to said collector of said second transistor; and
        a third resistor operatively connected between said voltage supply means and said second diode.

4. A field programmable device according to claim 3, wherein said voltage supply means comprises a third resistor.

5. A field programmable device according to claim 3, wherein said voltage supply means comprises a series connection of a third resistor and a second diode.

6. A field programmable device operatively connected to receive a power source voltage, a supply voltage and an input signal, comprising:
    a plurality of word lines;
    a plurality of bit lines intersecting said word lines;
    a plurality of cells respectively, operatively connected at intersections of said word lines and said bit lines;
    a plurality of word drivers, respectively, operatively connected at the intersections of said word lines, for driving a corresponding said word line to a high or low level, each of said word drivers comprising:
        a first resistor operatively connected to ground;
        a first transistor having a base operatively connected to receive the input signal, having a collector operatively connected to receive the power source voltage and having an emitter operatively connected to said first resistor;

a first diode having an anode operatively connected to the supply voltage and having a cathode;

a second diode having an anode operatively connected to the power source voltage and having a cathode operatively connected to said cathode of said first diode;

a second resistor of one of said word drivers having a first end operatively connected between said cathode of said second diode and a second end operatively connected to one of said word lines, said first end also operatively connected to a respective first end of said second transistor of another said word driver; and a second transistor having a base connected to said emitter of said first transistor, having an emitter connected to ground and having a collector operatively connected to one of said word lines.

7. A field programmable device operatively connected to a plurality of word lines and operatively connected to receive an input signal, comprising:

a first resistor operatively connected to ground;

a first transistor having a base operatively connected to receive the input signal, having a collector operatively connected to a power source, and having an emitter operatively connected to said first resistor;

a first diode having a cathode operatively connected to one of said word lines and having an anode;

a second transistor, having a base operatively connected to said emitter of said first transistor, having a collector operatively connected to said cathode of said first diode and having an emitter connected to ground;

a third transistor, having a base operatively connected to said collector of said first transistor, having an emitter operatively connected to said anode of said first diode, and having a collector operatively connected to the power source;

a second diode having a cathode having operatively connected to said cathode of said first diode and having an anode; and a second resistor operatively connected to said anode of said second diode.

* * * * *

UNITED STATES PATENT AND TRADEMARK OFFICE
CERTIFICATE OF CORRECTION

PATENT NO. : 4,488,261
DATED : DECEMBER 11, 1984
INVENTOR(S) : KOUJI UENO ET AL.

It is certified that error appears in the above-identified patent and that said Letters Patent is hereby corrected as shown below:

```
FRONT PAGE, [57] ABSTRACT
            line 6, "of comprising" should be
            --comprising--;
            line 9, "the word" should be --word--.

Col. 1, line 15, "point" should be --points--;
        line 31, "which" should be --(which--; and
                 "transistor" should be --transistor)--.

Col. 2, line 3, delete "ones of";
        line 48, "(FIG.3))" should be --(FIG. 3)--.

Col. 3, line 41, "and P-type" should be --P-type--.

Col. 4, line 47, "r" should be --r--.

Col. 6, line 32, "resistor" should be --resistor;--.
```

Signed and Sealed this

Seventh Day of May 1985

[SEAL]

Attest:

DONALD J. QUIGG

Attesting Officer     Acting Commissioner of Patents and Trademarks